United States Patent
Liang et al.

(10) Patent No.: US 10,283,677 B2
(45) Date of Patent: May 7, 2019

(54) LED STRUCTURE AND FABRICATION METHOD

(71) Applicant: XIAMEN SANAN OPTOELECTRONICS TECHNOLOGY CO., LTD., Xiamen (CN)

(72) Inventors: Xinghua Liang, Xiamen (CN); Hongquan He, Xiamen (CN); Chia-en Lee, Xiamen (CN); Te-Ling Hsia, Xiamen (CN); Su-hui Lin, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 13 days.

(21) Appl. No.: 15/418,670

(22) Filed: Jan. 27, 2017

(65) Prior Publication Data

US 2017/0141271 A1    May 18, 2017

Related U.S. Application Data

(63) Continuation of application No. PCT/CN2015/078637, filed on May 11, 2015.

(30) Foreign Application Priority Data

Oct. 31, 2014  (CN) .......................... 2014 1 0600560

(51) Int. Cl.
| | |
|---|---|
| *H01L 33/46* | (2010.01) |
| *H01L 33/38* | (2010.01) |
| *H01L 33/00* | (2010.01) |
| *H01L 33/40* | (2010.01) |
| *H01L 33/50* | (2010.01) |

(52) U.S. Cl.
CPC ............ *H01L 33/46* (2013.01); *H01L 33/005* (2013.01); *H01L 33/38* (2013.01); *H01L 33/405* (2013.01); *H01L 33/50* (2013.01); *H01L 2933/0016* (2013.01); *H01L 2933/0025* (2013.01)

(58) Field of Classification Search
CPC ..... H01L 33/38; H01L 33/385; H01L 33/387; H01L 33/60
See application file for complete search history.

(56) References Cited

U.S. PATENT DOCUMENTS

| | | | |
|---|---|---|---|
| 8,872,205 B2 | 10/2014 | Yang | |
| 2010/0006881 A1* | 1/2010 | Seo | ...................... H01L 33/0079 257/98 |
| 2011/0272666 A1* | 11/2011 | Hung | ...................... H01L 33/22 257/13 |

FOREIGN PATENT DOCUMENTS

CN            102339920 A       2/2012

* cited by examiner

*Primary Examiner* — Mohammed R Alam
(74) *Attorney, Agent, or Firm* — Syncoda LLC; Feng Ma

(57) ABSTRACT

A light-emitting diode (LED) structure includes a substrate; a first semiconductor layer on the substrate; a light emitting layer on the first semiconductor layer; a second semiconductor layer on the light emitting layer; and an electrode on the semiconductor layer composed of a body and an extension body, wherein the electrode extension portion is in a certain angle with the contacting semiconductor layer and separates the electrode body from the light emitted to its top surface and sides with a semi-wrapping structure.

20 Claims, 20 Drawing Sheets

LED STRUCTURE AND FABRICATION METHOD

CROSS-REFERENCE TO RELATED APPLICATIONS

The present application is a continuation of, and claims priority to, PCT/CN2015/078637, filed May 11, 2015, which claims priorities to Chinese Patent Application No. CN 201410600560.0, filed Oct. 31, 2014. The disclosures of the above applications are hereby incorporated by reference in their entirety.

BACKGROUND

Solid state lighting, in particular, light emitting diodes (LEDs), due to long service life, environmental friendliness and high efficiency, has became a new generation of lighting sources in replace of fluorescent lamps/incandescent bulbs. However, directly-fabricated LEDs only emit monochromatic light and require mixture of several colors to obtain white light. At present, to produce white light LEDs, blue/ultra violet LEDs are used to activate light conversion materials, like fluorescent powder.

In most LEDs, electrodes are made of highly conductive materials like Au, which will absorb some light. Therefore, electrode light absorption greatly reduces light emitting efficiency. In white light chips of the prior art as shown in FIG. 1, an electrode 105 mainly absorbs: 1) the light $r_1$ from the light emitting layer 103 to the electrode bottom; 2) the light $r_2$ from the light emitting layer 103 to the electrode sides; and 3) the light $r_3$ scattered/excited from the light conversion material 107, like fluorescent powder, to the electrode top surface and sides.

To solve electrode light absorption, LED reflective electrodes in the prior art are divided into two types: 1) the electrode bottom is a reflector and its sides and top surface are still made of light-absorption metal. For LED chips with such electrodes, in particular, for white light chips, the light emitting efficiency is still reduced due to electrode light absorption; 2) the entire electrode is wrapped by reflective metal. However, the reflective metal, in general, Ag/Al, may cause electrode degradation due to metal electromigration during usage of LED chips.

SUMMARY

The present disclosure relates to an LED structure and the fabrication method thereof, which reduces electrode light absorption and electromigration of metal reflecting electrodes.

According to the first aspect of the present disclosure, an LED structure, comprising: a substrate; a first semiconductor layer on the substrate; a light emitting layer on the first semiconductor layer; a second semiconductor layer on the light emitting layer; an electrode on the semiconductor layer, composed of a body and an extension portion, wherein, the electrode extension portion is in a certain angle with the contacting semiconductor layer and separates the electrode body from the light emitted to its top surface and sides with a semi-wrapping structure.

In some embodiments, the electrode body is a multi-layer structure, wherein, the bottom layer is made of reflective metal for reflecting the light emitted from the light emitting layer to the electrode bottom surface; and the top layer is made of a metal not prone to electromigration for preventing the reflective metal on the bottom surface from electromigration during conductive process.

In some embodiments, in the electrode extension portion, the surface close to the electrode body is made of electromigration inert metal, and the outer side surface far from the electrode body is made of reflective metal for reflecting the light emitted to the upper surface and sides of the electrode body.

In some embodiments, the electrode extension portion is not higher than the electrode body.

In some embodiments, the electrode extension portion is in a(an) straight, obtuse and acute angle or any of their combinations with the contacting semiconductor layer.

In some embodiments, the electrode extension portion surface is a regular plane, an irregular plane or their combination.

In some embodiments, besides electrode regions, the LED structure also comprises light conversion materials.

According to a second aspect of the present disclosure, a fabrication method for LED structures, comprising: a) providing an LED wafer, which comprises a substrate for supporting and protecting the LED, a first semiconductor layer on the substrate, a light emitting layer on the first semiconductor layer and a second semiconductor layer on the first semiconductor layer; b) dividing the upper surface of the second semiconductor layer into an electrode region and a non-electrode region, and forming a shield layer in the non-electrode region; c) depositing an electrode layer on the LED wafer in a certain angle with the LED wafer surface to plate the electrode layer at the side wall of the shield layer next to the electrode region; d) removing the shield layer and its upper electrode layer and leaving the electrode layers in the electrode region and at the side wall of the shield layer, wherein, the electrode layer in the electrode region is the electrode body, and that at the side wall of the shield layer is the electrode extension portion.

In some embodiments, the angle θ between the depositing direction and the LED wafer surface meets that: 0°<θ<90°.

In some embodiments, the angle θ between the depositing direction and the LED wafer surface meets that: 30°≤θ≤80°.

In some embodiments, the deposited electrode layer is a multi-layer structure, where the initially-deposited metal layer is made of reflective metal.

In some embodiments, the deposited electrode layer is a multi-layer structure, where the lastly-deposited metal layer is made of an anti-electromigration metal.

In some embodiments, after fabrication of the electrode, light conversion material is deposited in other areas except the electrode.

According to a third aspect of the present disclosure, a fabrication method for LED structures, comprising: a) providing an LED wafer, which comprises a substrate for supporting and protecting the LED, a first semiconductor layer on the substrate, a light emitting layer on the first semiconductor layer and a second semiconductor layer on the first semiconductor layer; b) dividing the upper surface of the second semiconductor layer into an electrode region and a non-electrode region, and forming a light conversion layer in the non-electrode region; c) depositing a shield layer on the light conversion layer and exposing the electrode region; d) depositing an electrode layer on the LED wafer in a certain angle with the LED wafer surface to plate the electrode layer at the side wall of the light conversion layer next to the electrode region; e) removing the shield layer and its upper electrode layer and leaving the electrode layers in the electrode region and at the side wall of the light conversion layer, wherein, the electrode layer in the electrode region is the electrode body, and that at the side wall of the shield layer is the electrode extension portion.

In some embodiments, the angle θ between the depositing direction and the LED wafer surface meets that: 0°<θ<90°.

In some embodiments, the angle θ between the depositing direction and the LED wafer surface meets that: 30°≤θ≤80°.

In some embodiments, the deposited electrode layer is a multi-layer structure, where the initially-deposited metal layer is made of reflective metal.

In some embodiments, the deposited electrode layer is a multi-layer structure, where the lastly-deposited metal layer is made of an anti-electromigration metal. While the invention will be described in conjunction with exemplary embodiments and methods of use, it will be understood by those skilled in the art that such description is not intended to limit the scope of the present disclosure, and various alternations, modifications and equivalents may be made therein without departing from the spirit and scope of the invention as defined by the appended claims.

In another aspect, a light-emitting system is provided including a plurality of the LEDs described above. The light-emitting system can be used, for example, for lighting, display, signage, etc.

Figure 1:
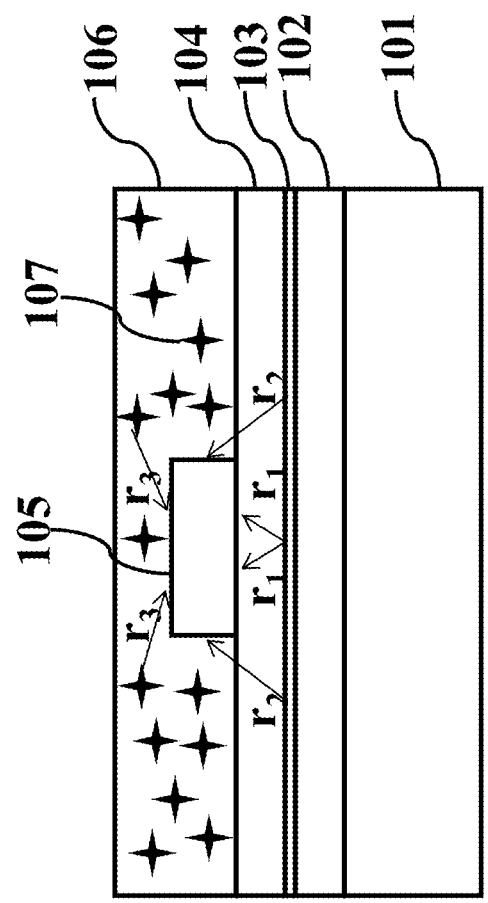
FIG. 1 is a schematic diagram of electrode light absorption of a conventional white light LED.

In the drawings:
- 101, 201, 301, 401, 501, 601: substrate;
- 102, 202, 302, 402, 502, 602: first semiconductor layer;
- 103, 203, 303, 403, 503, 603: light emitting layer;
- 104, 204, 304, 404, 504, 604: second semiconductor layer;
- 204a, 304a: electrode region;
- 105, 205, 305, 405, 505, 605: electrode;
- 106, 306: light conversion layer;
- 107, 307: light conversion material;
- 208, 308, 408, 508, 608: electrode body;
- 209, 309, 409, 509, 609: electrode extension portion;
- 210, 310, 410, 510, 610: reflective metal layer;
- 211, 311, 411, 511, 611: anti-electromigration metal layer;
- 212, 312: shield layer;
- 212a: side wall of the shield layer next to the electrode region;
- 214: metal evaporation source.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this invention.

Embodiment 1

Figure 2:
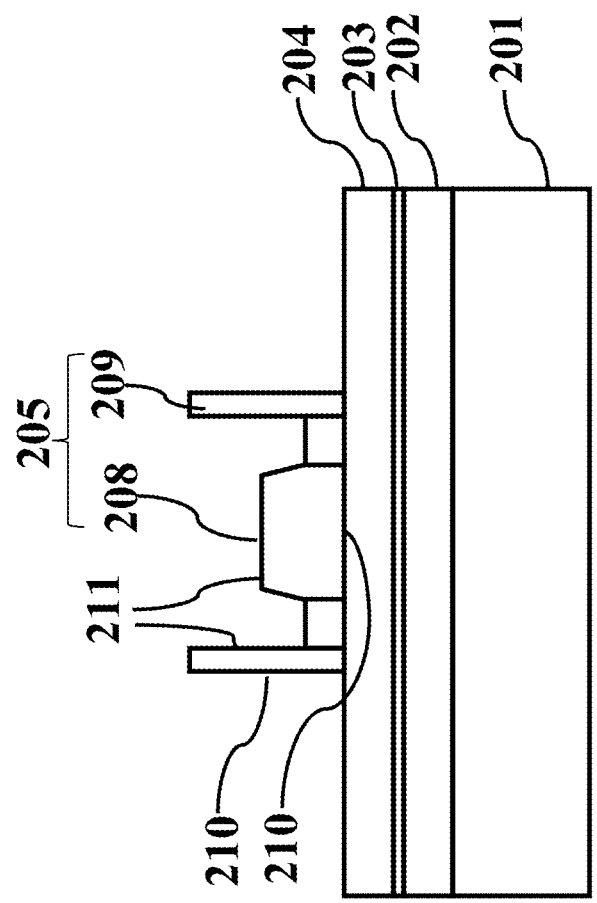
FIG. 2 is a sectional view of an LED structure according to Embodiment 1, wherein, the electrode extension portion is in a straight angle with the semiconductor layer surface.
Figure 3:
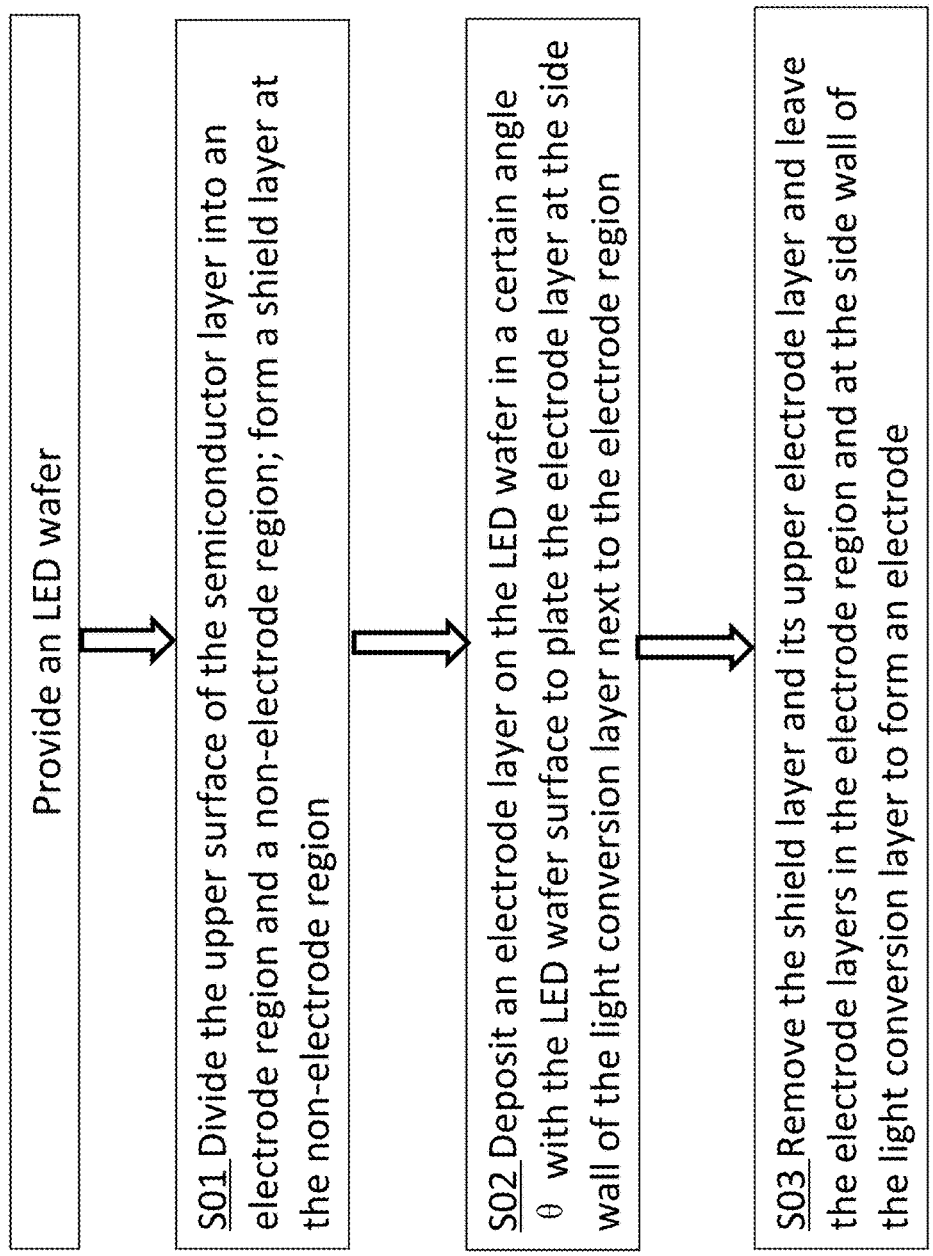
FIG. 3 is a flow diagram for one mode of implementation of Embodiment 1.

FIG. 2 is a sectional view of the LED structure according to a first preferred embodiment of the present disclosure. This embodiment will be described in detail with reference to the fabrication method thereof. Refer to FIG. 3 for the fabrication process.

Figure 4:
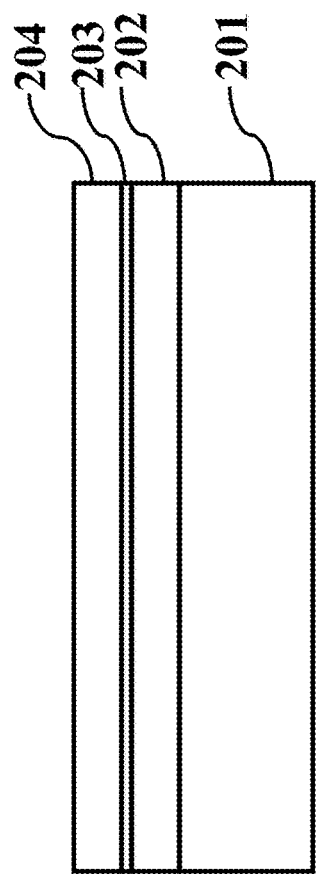
FIG. 4 illustrates a first step in manufacturing the LED structure of Embodiment 1.

As shown in FIG. 4, provide an LED wafer, comprising a substrate 201 for supporting and protecting the LED, a first semiconductor layer 202 on the substrate, a light emitting layer 203 on the first semiconductor layer 202 and a second semiconductor layer 204 on the light emitting layer 203. In this embodiment, the substrate 201 is made of high conductive material (e.g., Si, Cu, CuW alloy). Of course, besides conductive material, the substrate 201 can be made of insulating material (e.g., substrate) based on specific devices. When the first semiconductor layer 202 is a p-type semiconductor, the second semiconductor layer 204 can be an n-type semiconductor in different electrical property and vice versa. The light emitting layer 203 is between the first semiconductor layer 202 and the second semiconductor layer 204, which can be a neutral-type, a p-type or an n-type semiconductor. When the applied current passes through the light-emitting epitaxial laminated layer, the light emitting layer 203 is excited to emit light. When the light emitting layer 203 is made of nitride-based material, blue or green light will be emitted; when made of AlInGaP-based material, red, orange or yellow light in amber color will be emitted.

Figure 5:
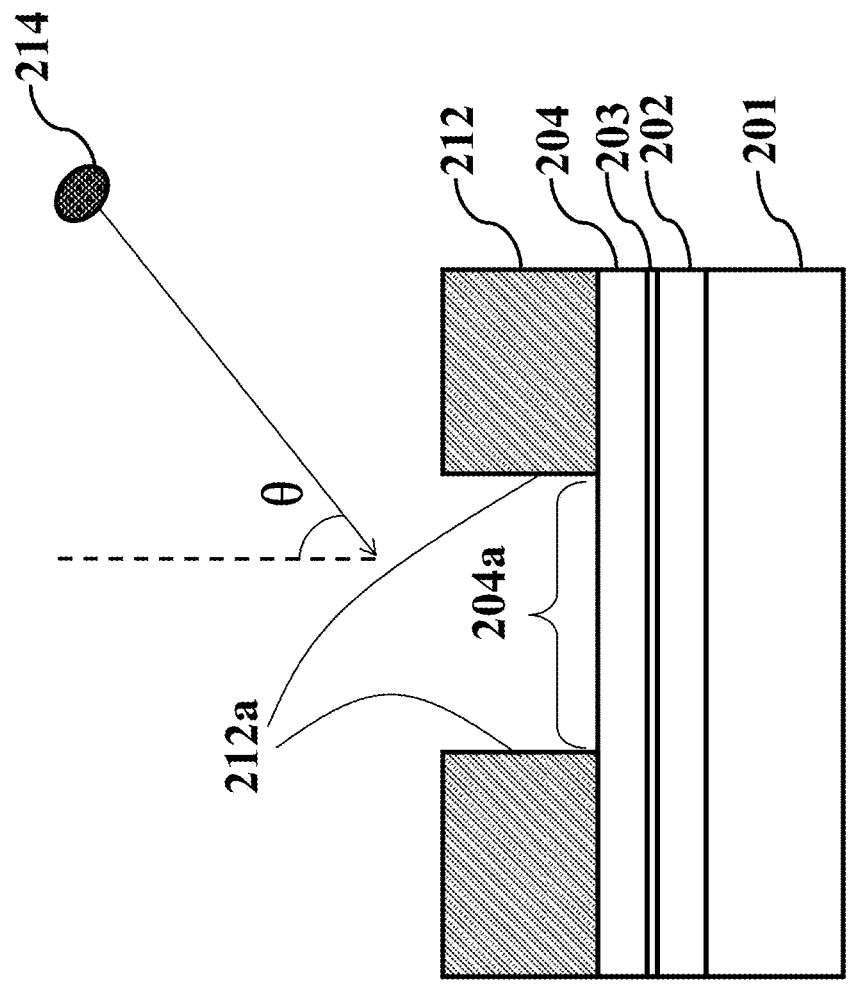
FIG. 5 illustrates a second step in manufacturing the LED structure of Embodiment 1.

S01: divide the upper surface of the second semiconductor layer 204 into an electrode region 204a and a non-electrode region; form a shield layer 212 in the non-electrode region and expose the electrode region, wherein, the angle of the side wall 212a of the shield layer next to the electrode region is designed based on electrode structures. As shown in FIG. 5, the designed angle is a straight angle; preferably, the shield layer 212 is made of photosensitive material like photoresist.

Figure 6:
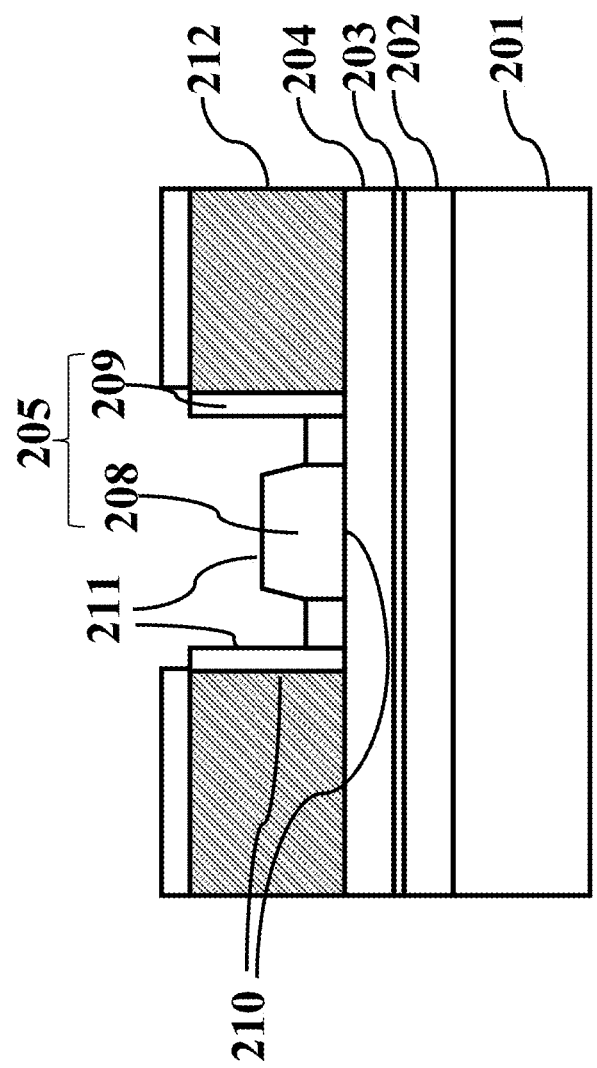
FIG. 6 illustrates a third step in manufacturing the LED structure of Embodiment 1.
Figure 7:
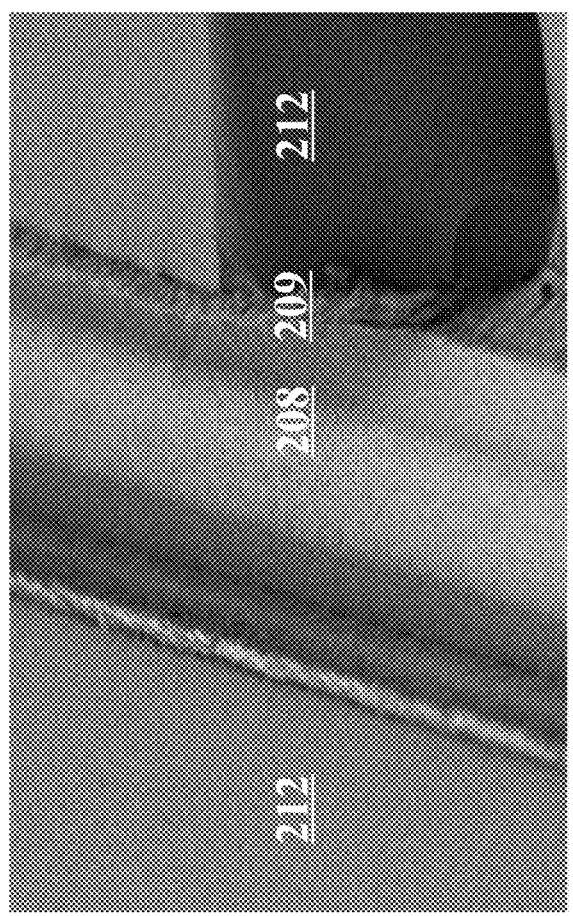
FIG. 7 is an SEM image for the electrode before removal of the shield layer of Embodiment 1.

S02: as shown in FIG. 5, deposit an electrode layer on the LED wafer in a certain angle θ with the LED wafer surface to plate the electrode layer at the side wall 212a of the shield layer next to the electrode region. Referring to FIG. 6, in some embodiments, the electrode layer is a multi-layer structure, wherein, the reflective metal layer 210 is initially deposited and the anti-electromigration metal layer 211 is lastly deposited; and the angle θ between the depositing direction and the LED wafer surface is from 0° to 90°. Preferable, the angle between the depositing direction of the electrode layer and the LED wafer is 60°; the reflective metal 210 is Ag, Al or their alloy; and the anti-electromigration metal 211 is Au, Pt or their alloy. Referring to FIG. 7, as shown in the SEM image, the electrode layer is formed in the electrode region 204a of the second semiconductor layer and at the side wall 212a of the shield layer next to the electrode region.

Figure 8:
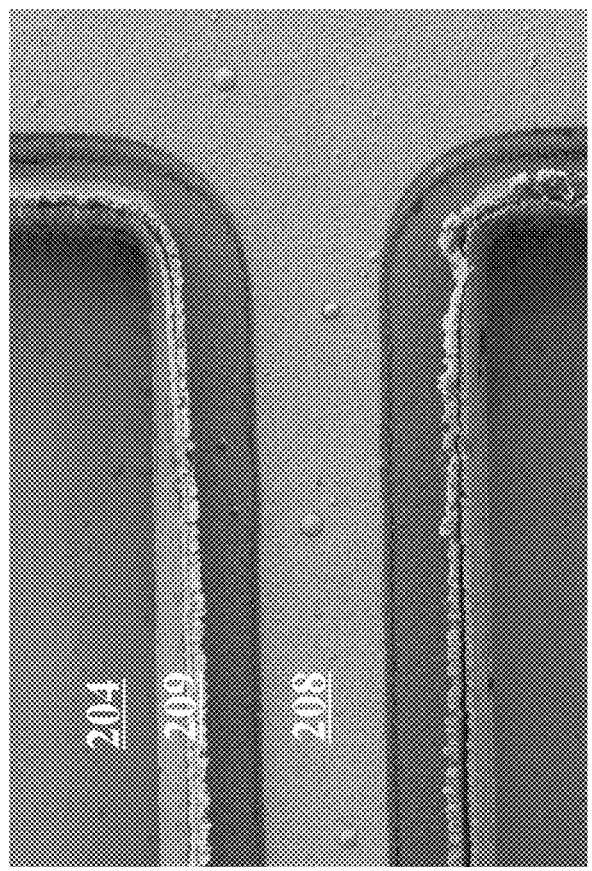
FIG. 8 is a top-view SEM image for the electrode after removal of the shield layer of Embodiment 1.
Figure 9:
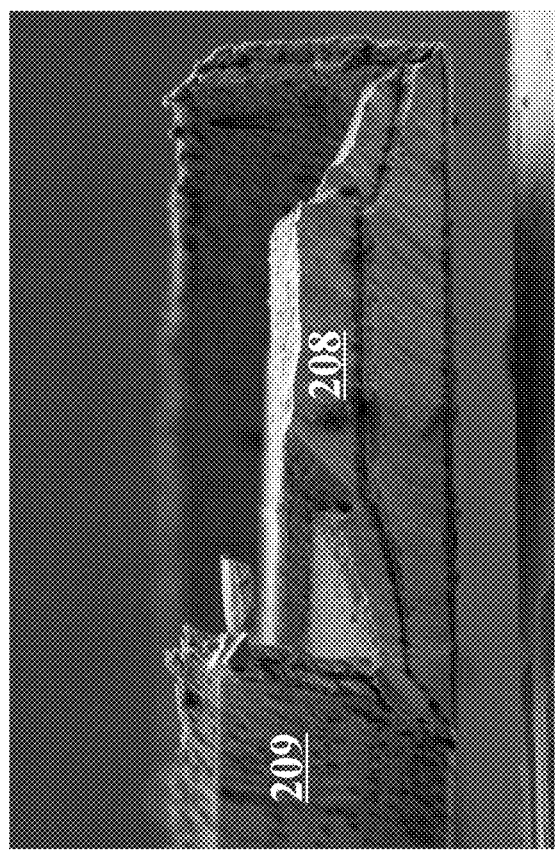
FIG. 9 is a sectional view SEM image for the electrode after removal of the shield layer of Embodiment 1.

S03: remove the shield layer and its upper electrode layer and leave the electrode layers in the electrode region and at the side wall of the shield layer. Refer to FIGS. 8-9 for the structure, wherein, the electrode layer 208 in the electrode region is the electrode body and the electrode layer 209 at the side wall of the shield layer is the electrode extension portion, which constitute an electrode 205.

In this embodiment, metal reflecting layers 210 are formed at the bottom and side walls of the LED electrode, which can reflect the light reflected by the light emitting layer, thus reducing light emitting efficiency decrease caused by electrode light absorption. The reflective layer 211 of the electrode extension portion is exposed but the metal in the extension portion is not prone to electromigration because the electrode extension portion is not for conduction. Though the electrode body is mainly for conduction, the anti-electromigration metal on the upper of the metal reflecting layer reduces the electromigration risk to the minimum. Therefore, the present disclosure reduces electrode light absorption and electromigration of metal reflecting electrodes.

Embodiment 2

Figure 10:
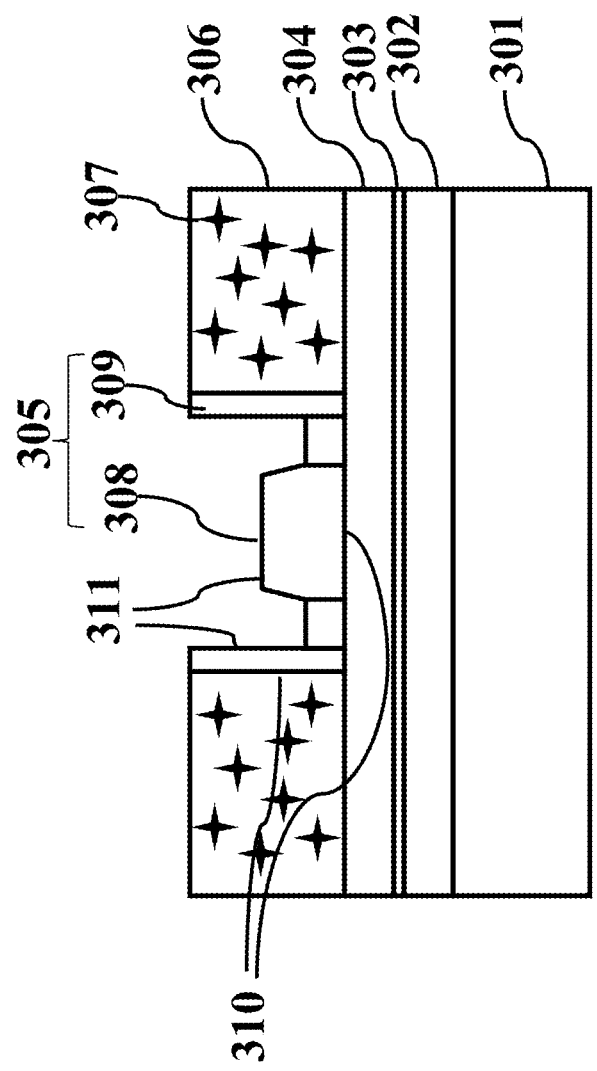
FIG. 10 is a structural sectional view of Embodiment 2 comprising a light conversion layer based on Embodiment 1.

FIG. 10 is a sectional view of the LED structure according to a second preferred embodiment of the present disclosure. This embodiment will be described in detail with reference to the fabrication method thereof.

Figure 11:
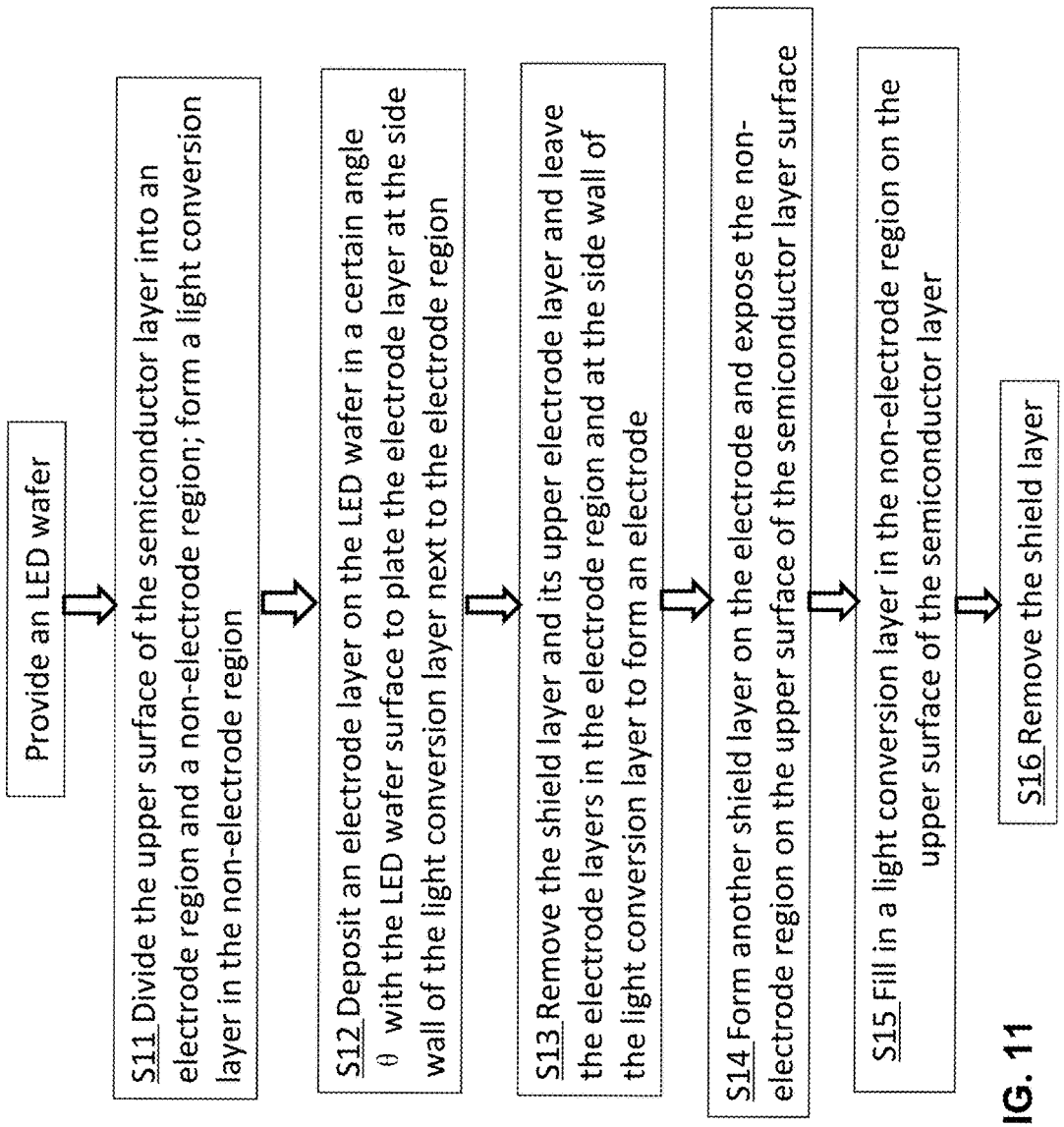
FIG. 11 is a flow diagram for one mode of implementation of Embodiment 2.

As shown in FIG. 10, different from Embodiment 1, in this embodiment, a light conversion layer 306 is covered in the non-electrode region of the second semiconductor layer 304. Refer to FIG. 11 for the fabrication process of this embodiment.

First, fabricate an LED structure basically same as that in Embodiment 1 following S11-S13, which are basically similar to S01-S03 in Embodiment 1. In this embodiment, as the electrode extension portion 309 is to reflect the light emitted from the light conversion layer 306 to the electrode 305, the height of the electrode extension portion 309 is not lower than the thickness of the light conversion layer 306; preferably, the electrode extension portion 309 is thicker than 10 μm; accordingly, the shield layer formed in S11 is preferably thicker than 10 μm; Futurrex, AZ electronic material or JSR Corporation photoresist can be used.

Figure 12:
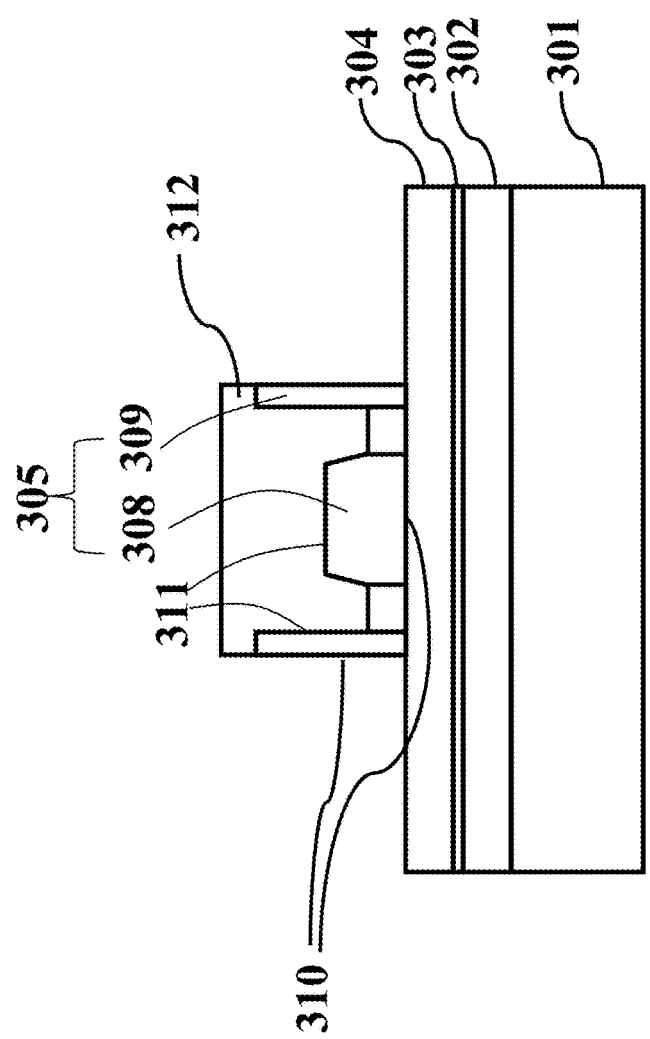
FIG. 12 is a sectional view of an LED in a first step of fabrication shown in FIG. 11.

S14: referring to FIG. 12, cover a shield layer 312 on the electrode 305.

Figure 13:
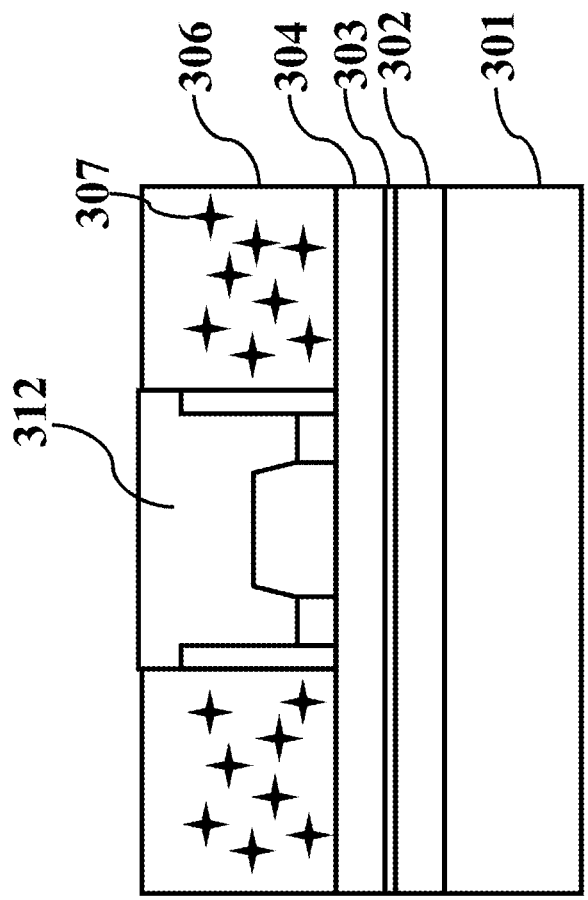
FIG. 13 is a sectional view of an LED in a second step of fabrication shown in FIG. 11.

S15, referring to FIG. 13, on the second semiconductor layer 304, fill in a light conversion layer 307 on areas except the electrode 305. Specifically, coat the light conversion layer on the entire plane and grind the light conversion layer above the electrode 305 to expose the shield layer. Preferably, the light conversion layer is made of mixture of silica gel and fluorescent powder.

S16: remove the shield layer 312.

In this embodiment, the LED electrode completely reflects the light emitted by the light conversion layer to the electrode, which greatly reduces electrode light absorption and improves light emitting efficiency, which can be directly applied in white light LED structures.

Figure 14:
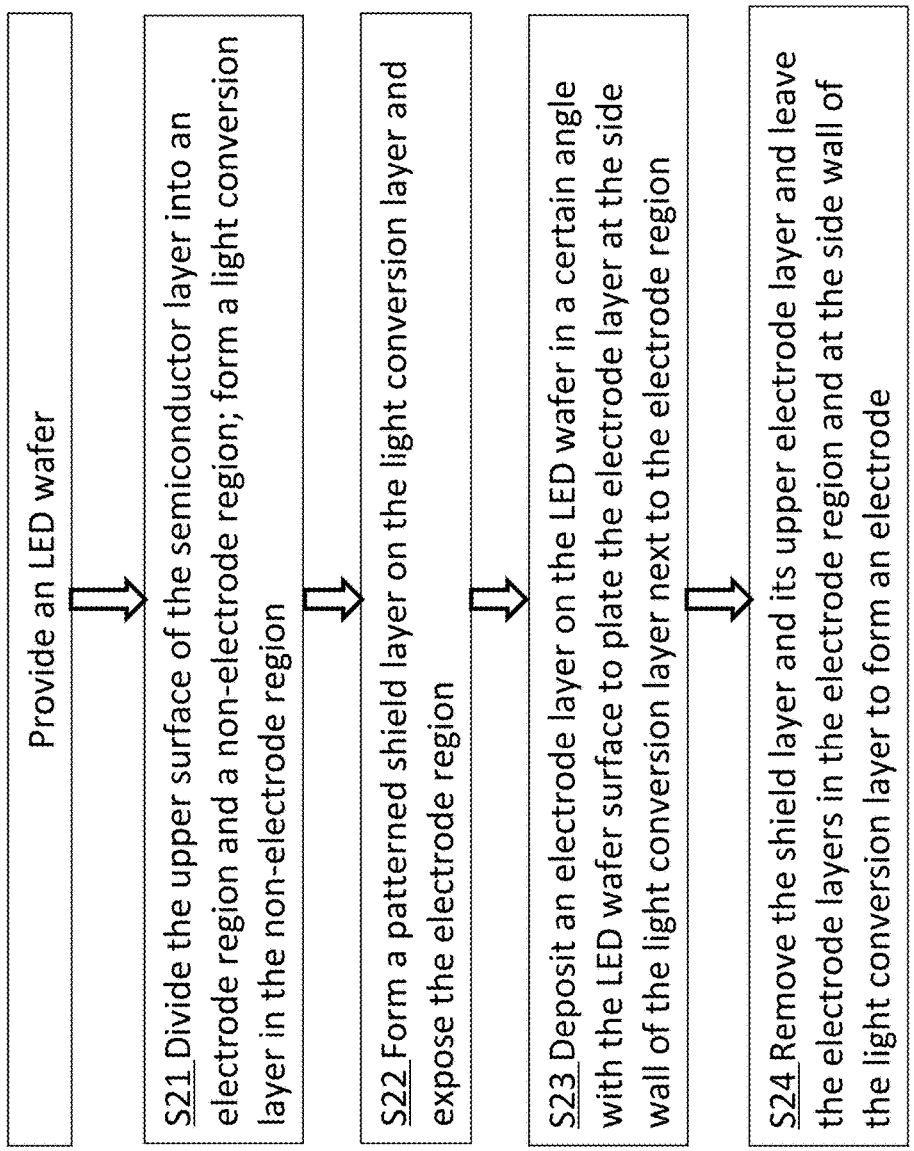
FIG. 14 is a flow diagram for another mode of implementation of Embodiment 2.

The LED structure of this embodiment can be fabricated through another method as shown below. Refer to FIG. 14 for the fabrication process.

First, provide an LED wafer, comprising a substrate 301 for supporting and protecting the LED, a first semiconductor layer 302 on the substrate 301, a light emitting layer 303 on the first semiconductor layer 302 and a second semiconductor layer 304 on the light emitting layer 303.

Figure 15:
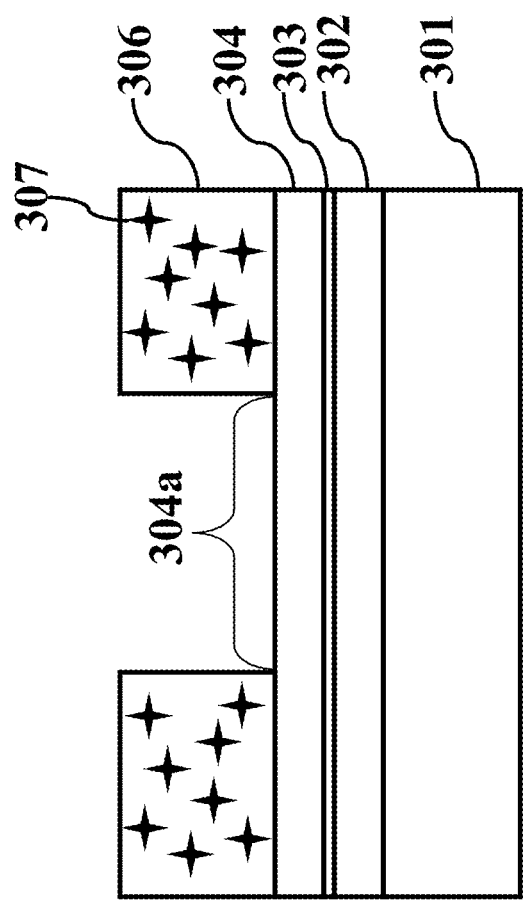
FIG. 15 is a sectional view of an LED in a first step of fabrication shown in FIG. 14.

S21: divide the upper surface of the second semiconductor layer 304 into an electrode region 304a and a non-electrode region, wherein, form a patterned light conversion layer 306 in the non-electrode region and expose the electrode region, as shown in FIG. 15. Preferably, the light conversion layer is made of mixture of silica gel and fluorescent powder.

Figure 16:
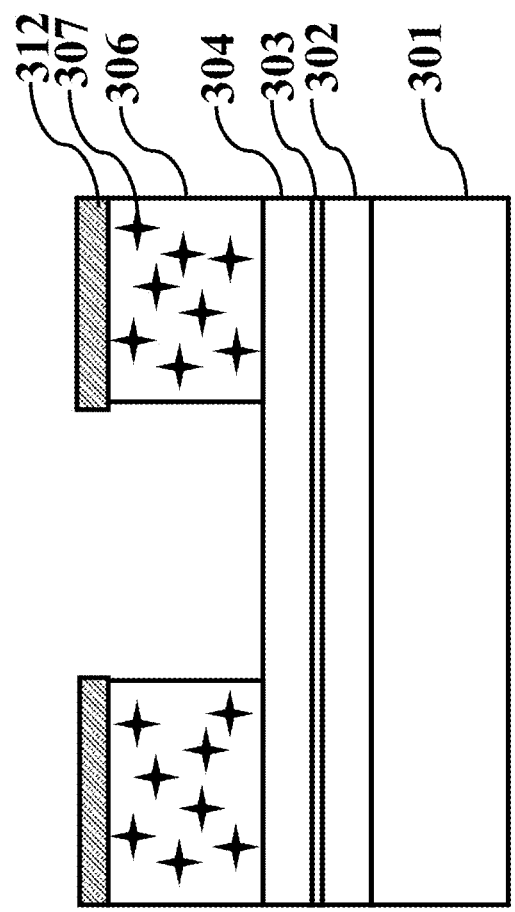
FIG. 16 is a sectional view of an LED in a second step of fabrication shown in FIG. 14.

S22: form a shield layer 312 on the light conversion layer 306 and expose the electrode region, as shown in FIG. 16.

Figure 17:
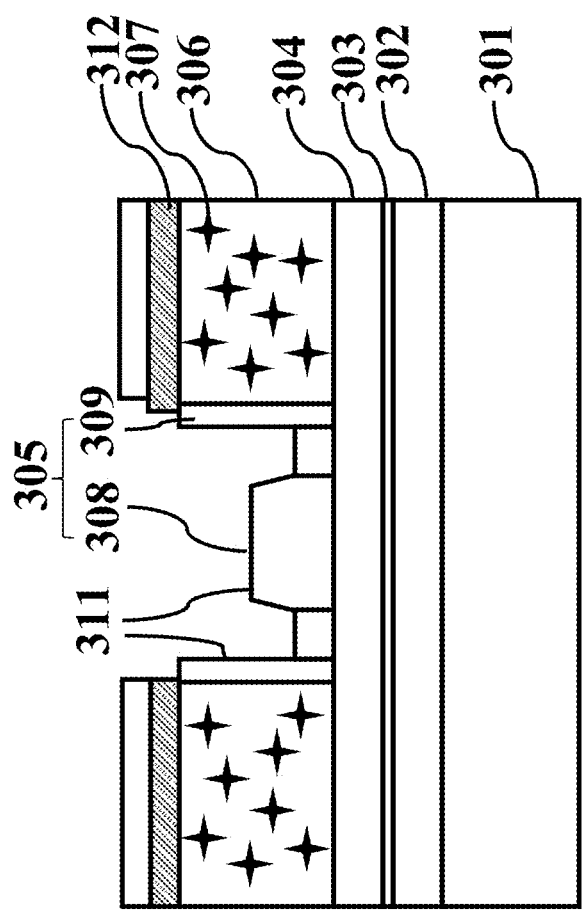
FIG. 17 is a sectional view of an LED in a third step of fabrication shown in FIG. 14.

S23: deposit an electrode layer on the LED wafer in a certain angle θ with the LED wafer surface to plate the electrode layer at the side wall of the light conversion layer 306 next to the electrode region. Specifically, deposit metal layers in sequence on the LED wafer by initially depositing the reflective metal layer 310 and lastly depositing the anti-electromigration metal layer 311, as shown in FIG. 17. Preferably, the angle between the metal depositing direction and the LED wafer surface is from 30° to 80°.

S24: remove the shield layer 312 and its upper electrode layer and leave the electrodes in the electrode region and at the side wall of the light conversion layer.

In this embodiment, the electrode is made through the electrode region defined by the light conversion layer and the light conversion layer can protect the electrode extension portion, which reduces difficulty in mass production.

Embodiment 3

Figure 18:
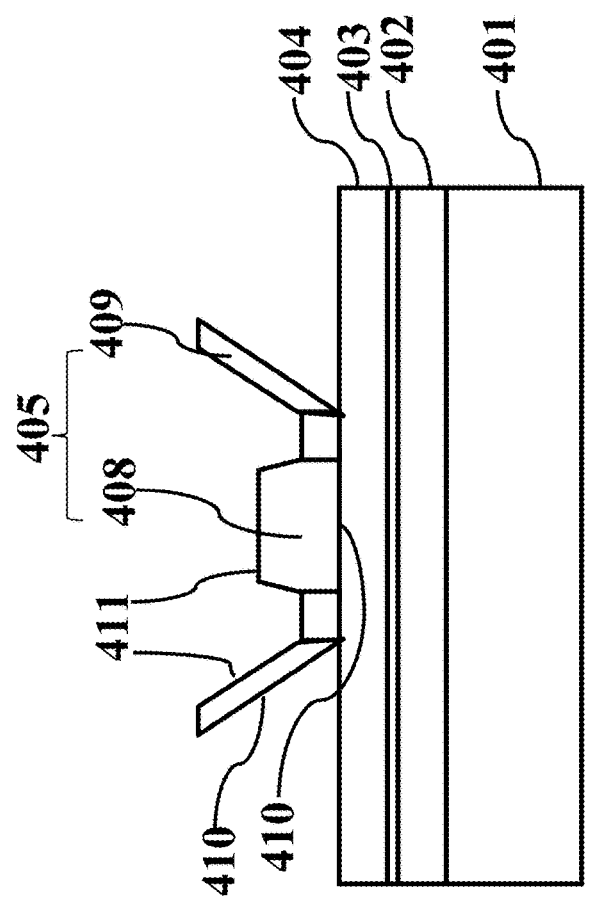
FIG. 18 is a sectional view of an LED structure of Embodiment 3, wherein, the electrode extension portion is in an obtuse angle with the semiconductor layer surface.

FIG. 18 is a sectional view of the LED structure according to a third preferred embodiment. Different from Embodiment 1, in this embodiment, the electrode extension portion 409 is in an acute angle with the LED device surface and forms a "W" shape with the electrode body 408. The fabrication process is similar to that stated in Embodiment 1. Key step S01: form a shield layer on the semiconductor layer and expose the electrode region, and the side wall of the shield layer next to the electrode region is designed as an obtuse angle. During actual fabrication, the angle can be controlled through the type of shield layers, exposure energy and development time. Preferably, in this embodiment, the shield layer is made of positive photoresist.

The LED structure according to this embodiment, on the one hand, reduces electrode light absorption and electromigration of metal reflecting electrodes; and on the other hand, reflects more light back to the back surface due to angle control of the electrode extension portion, which is more suitable for flip chips.

Embodiment 4

Figure 19:
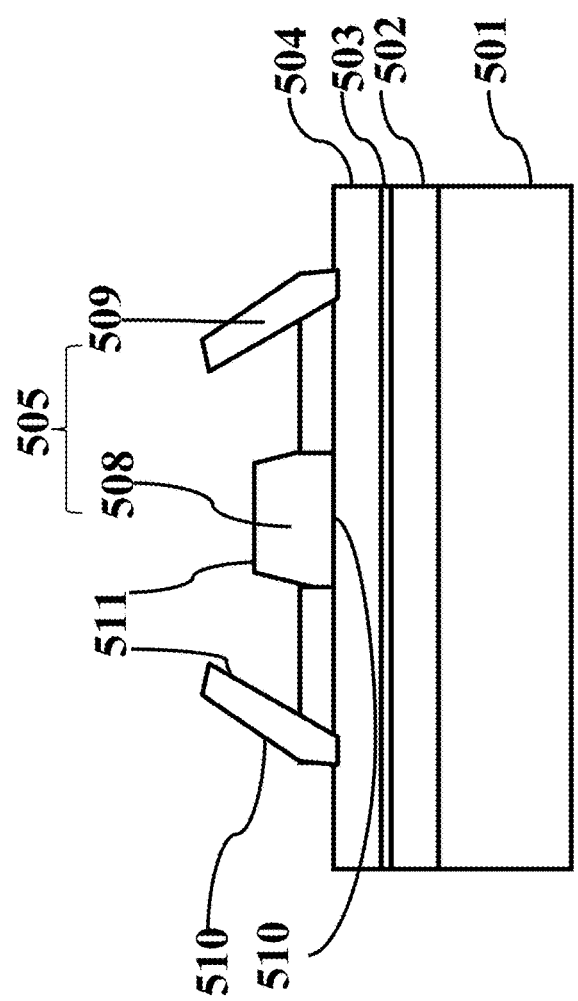
FIG. 19 is a sectional view of an LED structure of Embodiment 4, wherein, the electrode extension portion is in an acute angle with the semiconductor layer surface.

FIG. 19 is a sectional view of the LED structure according to a fourth preferred embodiment. Different from Embodiment 1, in this embodiment, the electrode extension portion 509 is in an acute angle with the LED device surface. The fabrication process is similar to that stated in Embodiment 1. Key step S01: form a shield layer on the semiconductor layer and expose the electrode region, and the side wall of the shield layer next to the electrode region is designed as an obtuse angle. During actual fabrication, the angle can be controlled through the type of shield layers, exposure energy and development time. Preferably, in this embodiment, the shield layer is made of negative photoresist.

The LED structure according to this embodiment, on the one hand, reduces electrode light absorption and electromigration of metal reflecting electrodes; and on the other hand, emits more light to the front surface due to angle control of the electrode extension portion, which is more suitable for applications requiring large light emitting angle.

Due to limited contents, in Embodiments 1, 3 and 4, the angle between the electrode extension portion and the semiconductor layer surface in each embodiment has only one type from obtuse angle, straight angle or acute angle. In more complicated designs, however, different angles are possible in one embodiment, i.e., the angle between the electrode extension portion and the semiconductor layer surface can be any one of obtuse angle, straight angle or acute angle or their combinations.

Embodiment 5

Figure 20:
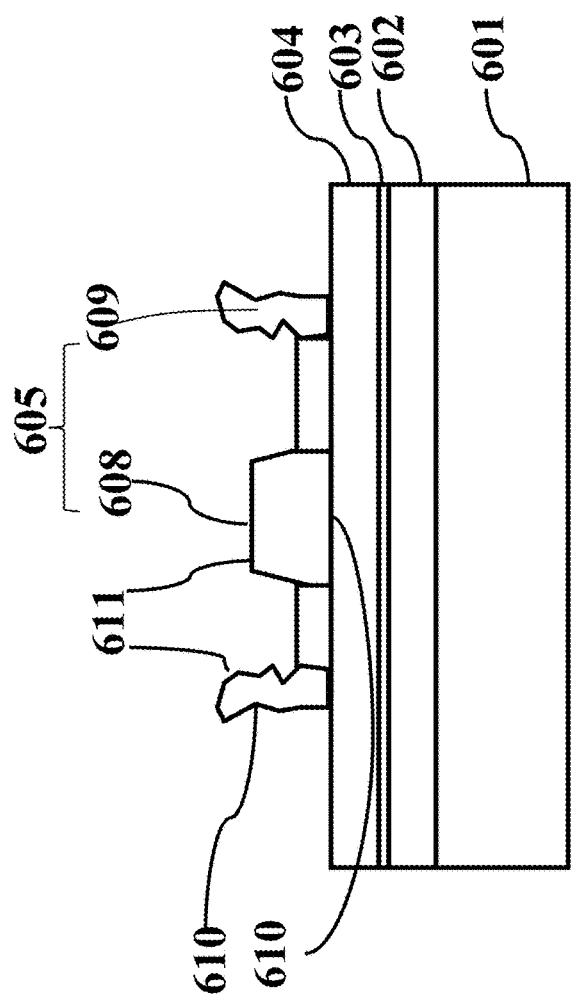
FIG. 20 is a sectional view of an LED structure of Embodiment 5, wherein, the electrode extension portion is irregular.

In the aforesaid embodiments, the electrode extension portion surfaces are regular planes, but in actual applications, they can be irregular structures. FIG. 20 is a sectional view of the LED structure according to a fifth preferred embodiment. Different from Embodiment 1, in this embodiment, the electrode extension portion 609 is an irregular structure. The fabrication process is similar to that stated in Embodiment 1. Key step S01: form a patterned shield layer on the semiconductor layer and expose the electrode region, and the side wall of the shield layer next to the electrode region is designed as an obtuse angle. To obtain an irregular surface structure:

1) Subtly design the thickness of the shield layer to make the light of the exposure source diffract on the semiconductor layer surface, thus forming a wave-shape electrode extension portion;

2) After fabrication of the shield layers in Embodiments 1, 3 and 4 following step S01, take chemical etching or ICP etching for the shield layer surface to make it a special form, thereby obtaining an irregular electrode extension portion.

The LED structure according to this embodiment, on the one hand, reduces electrode light absorption and electromigration of metal reflecting electrodes; and on the other hand, is suitable for special applications due to angle control of the electrode extension portion.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) structure, comprising: a substrate; a first semiconductor layer over the substrate; a light emitting layer over the first semiconductor layer; a second semiconductor layer over the light emitting layer; and an electrode over the second semiconductor layer and comprising a body and an extension portion separated from the body and are in contact with the second semiconductor layer, wherein the electrode extension portion with a semi-wrapping structure is in a specified angle with the second semiconductor layer and configured to reflect light that is directed toward a top surface and sides of the electrode body, away from the electrode body to thereby reduce light absorption by the electrode body.

2. The LED structure of claim 1, wherein: the electrode body is a multi-layer structure; a bottom layer of the electrode body comprises a reflective metal configured to reflect light that is directed toward a bottom surface of the electrode body, away from the bottom surface; and a top layer of the electrode body comprises an anti-electromigration metal configured to prevent the reflective metal from electromigration during a conductive process.

3. The LED structure of claim 1, wherein in the electrode extension portion, a surface proximal to the electrode body comprises an anti-electromigration metal, and an outer side surface distal from the electrode body comprises a reflective metal configured to reflect light that is directed toward the top surface and sides of the electrode body.

4. The LED structure of claim 1, wherein the electrode extension portion is not lower than the electrode body.

5. The LED structure of claim 1, wherein the electrode extension portion is in a straight, obtuse, or acute angle, or any combination thereof, with the second semiconductor layer which the electrode extension portion is in contact with.

6. The LED structure of claim 1, wherein the electrode extension portion has a surface that is a regular plane, an irregular plane, or a combination thereof.

7. The LED structure of claim 1, further comprising light conversion materials outside the electrode.

8. A fabrication method for a light-emitting diode (LED) structure, the method comprising: a) providing an LED wafer comprising a substrate for supporting and protecting the LED structure, a first semiconductor layer over the substrate, a light emitting layer over the first semiconductor layer, and a second semiconductor layer over the first semiconductor layer; b) dividing an upper surface of the second semiconductor layer into an electrode region and a non-electrode region, and forming a shield layer in the non-electrode region; c) depositing an electrode layer over the LED wafer in a specified angle θ with a surface of the LED wafer to plate the electrode layer at a side wall of the shield layer adjacent to the electrode region; and d) removing the shield layer and a portion of the electrode layer over the shield layer, and leaving the electrode layer in the electrode region and at the side wall of the shield layer, wherein the electrode layer at the electrode region is the electrode body, and the electrode layer at the side wall of the shield layer is the electrode extension portion; wherein the fabricated LED structure comprises: the substrate; the first semiconductor layer over the substrate; the light emitting layer over the first semiconductor layer; the second semiconductor layer over the light emitting layer; and the electrode over the second semiconductor layer and comprising a body and the extension portion separated from the body and are in contact with the second semiconductor layer, wherein the electrode extension portion with a semi-wrapping structure is in the specified angle θ with the second semiconductor layer and configured to reflect light that is directed toward a top surface and sides of the electrode body, away from the electrode body to thereby reduce light absorption by the electrode body.

9. The fabrication method of claim 8, wherein 0°<θ<90°.

10. The fabrication method of claim 8, wherein 30°≤θ≤80°.

11. The fabrication method of claim 8, wherein the deposited electrode layer is a multi-layer structure with a first-deposited layer made of a reflective metal.

12. The fabrication method of claim 8, wherein the deposited electrode layer is a multi-layer structure with a last-deposited layer made of an anti-electromigration metal.

13. The fabrication method of claim 8, wherein after fabrication of the electrode, a light conversion material is deposited in areas outside the electrode.

14. A fabrication method for a light-emitting diode (LED) structure, the method comprising: a) providing an LED wafer, which comprises a substrate for supporting and protecting the LED, a first semiconductor layer on the substrate, a light emitting layer on the first semiconductor layer and a second semiconductor layer on the first semiconductor layer; b) dividing the upper surface of the second semiconductor layer into an electrode region and a non-electrode region, and forming a light conversion layer in the non-electrode region; c) depositing a shield layer on the light conversion layer and exposing the electrode region; d) depositing an electrode layer on the LED wafer in a specified angle θ with the LED wafer surface to plate the electrode layer at the side wall of the light conversion layer next to the electrode region; e) removing the shield layer and a portion of the electrode layer over the shield layer and leaving the electrode layer in the electrode region and at the side wall of the light conversion layer, wherein, the electrode layer in the electrode region is the electrode body and that at the side wall of the light conversion layer is the electrode extension portion; wherein the fabricated LED structure comprises: the substrate; the first semiconductor layer over the substrate; the light emitting layer over the first semiconductor layer; the second semiconductor layer over the light emitting layer; and the electrode over the second semiconductor layer and comprising a body and the extension portion separated from the body and are in contact with the second semiconductor layer, wherein the electrode extension portion with a semi-wrapping structure is in the specified angle θ with the second semiconductor layer and configured to reflect light that is directed toward a top surface and sides of the electrode body, away from the electrode body to thereby reduce light absorption by the electrode body.

15. The fabrication method of claim 14, wherein 0°<θ<90°.

16. The fabrication method of claim 14, wherein 30°≤θ≤80°.

17. The fabrication method of claim 14, wherein the deposited electrode layer is a multi-layer structure with a first-deposited metal layer made of a reflective metal.

18. The fabrication method of claim 14, wherein the deposited electrode layer is a multi-layer structure with a last-deposited layer made of an anti-electromigration metal.

19. The fabrication method of claim 14, wherein the electrode extension portion is not lower than the electrode body.

20. The fabrication method of claim 14, wherein the electrode extension portion is in an acute angle with the second semiconductor layer which the electrode extension portion is in contact with.

* * * * *